United States Patent [19]

Lieneweg

[11] Patent Number: 4,725,773
[45] Date of Patent: Feb. 16, 1988

[54] CROSS-CONTACT CHAIN

[75] Inventor: Udo Lieneweg, Altadena, Calif.

[73] Assignee: The United States of America as represented by the Administrator of the National Aeronautics and Space Administration, Washington, D.C.

[21] Appl. No.: 879,757

[22] Filed: Jun. 27, 1986

[51] Int. Cl.[4] .................. G01R 27/02; G01R 31/02
[52] U.S. Cl. .................. 324/73 R; 324/158 R; 324/65 R; 324/64
[58] Field of Search .............. 324/73 R, 158 R, 64, 324/62, 65 R

[56] References Cited

U.S. PATENT DOCUMENTS

| | | | |
|---|---|---|---|
| 3,134,077 | 5/1984 | Hutchings, IV et al. | 324/64 |
| 3,388,457 | 6/1968 | Totta | 437/8 |
| 3,416,078 | 12/1968 | Boncuk et al. | 324/64 |
| 3,507,036 | 4/1970 | Antipov et al. | 437/8 |
| 3,609,537 | 9/1971 | Healy | 324/64 |
| 3,641,661 | 2/1972 | Canning et al. | 437/8 |
| 3,735,253 | 5/1973 | Seger | 324/64 |
| 3,771,217 | 11/1973 | Hartman | 437/8 |
| 3,788,911 | 1/1974 | Unger | 156/3 |
| 3,795,974 | 3/1974 | Calhoun | 437/8 |
| 3,808,527 | 4/1974 | Thomas | 324/64 |
| 3,808,527 | 4/1974 | Thomas | 324/65 R |
| 3,835,530 | 9/1974 | Kilby | 437/8 |
| 3,861,023 | 1/1975 | Bennett | 437/8 |
| 4,104,785 | 8/1978 | Shiba et al. | 437/8 |
| 4,144,493 | 3/1979 | Lee et al. | 324/158 R |
| 4,218,650 | 8/1980 | Matzen | 324/64 |
| 4,244,048 | 1/1981 | Tsui | 371/15 |
| 4,288,911 | 9/1981 | Ports | 437/8 |
| 4,309,811 | 1/1982 | Calhoun | 437/8 |
| 4,335,350 | 6/1982 | Chen | 324/64 |
| 4,386,459 | 6/1983 | Boulin | 437/8 |
| 4,440,799 | 4/1984 | Faith | 427/8 |
| 4,479,088 | 10/1984 | Stopper | 324/73 R |
| 4,516,071 | 5/1985 | Buehler | 324/158 R |

FOREIGN PATENT DOCUMENTS 0040949 3/1982 Japan .................. 324/64

OTHER PUBLICATIONS

Benjamin; "Semiconductor Resistance Measuring Technique"; IBM Technical Disclosure Bulletin; vol. 10, No. 1; 06/1967; p. 97.

Russell et al; "A Comparison of Electrical and Visual Alignment Test Structure for Evaluating Photomask Alignment in Integrated Circuit"; International Electro Devices Meeting Technical Digest; Dec. 1977, pp. 7A-7F.

Primary Examiner—Ernest F. Karlsen
Assistant Examiner—Vinh P. Nguyen
Attorney, Agent, or Firm—Paul F. McCaul; John R. Manning; Thomas H. Jones

[57] ABSTRACT

A system is provided for use with wafers that include multiple integrated circuits that include two conductive layers in contact at multiple interfaces. Contact chains are formed beside the integrated circuits, each contact chain formed of the same two layers as the circuits, in the form of conductive segments alternating between the upper and lower layers and with the ends of the segments connected in series through interfaces. A current source passes a current through the series-connected segments, by way of a pair of current tabs connected to opposite ends of the series of segments. While the current flows, voltage measurements are taken between each of a plurality of pairs of voltage tabs, the two tabs of each pair connected to opposite ends of an interface that lies along the series-connected segments. A plot of interface conductances on a normal probability chart, enables prediction of the yield of good integrated circuits from the wafer.

12 Claims, 8 Drawing Figures

CROSS-CONTACT CHAIN

ORIGIN OF THE INVENTION

The invention described herein was made in the performance of work under a NASA contract, and is subject to the provisions of Public Law 96-517 (35 USC 202) in which the Contractor has elected not to retain title.

BACKGROUND OF THE INVENTION

A wafer containing numerous integrated circuits, will generally include at least two conductive (or semi-conductive) layers, one lying above the other and separated by an insulator, and with the layers interconnected at numerous interfaces. High resistance at such interfaces is a major source of defects. One way to measure interface resistance is to form one or more contact chains on the wafer, at locations adjacent to some or all of the integrated circuits. Each contact chain has many conductive segments formed in each layer, and the conductive segments are connected in series by interfaces between the layers. A pair of tabs is provided at opposite ends of a chain containing the many interfaces in series, and the resistance between the tabs is measured. While this can indicate the existance of a catastrophic failure (a very high resistance interface), it does not provide information as to the resistence at each of the many interfaces.

The detection of the resistance at each of several interfaces can be made by providing four pairs of terminals or tabs for each interface. Current can pass between a first pair of tabs while the voltage is measured across the other pair of tabs, to determine the resistance across that interface. However, the need for a large number of tabs such as 44 tabs for testing 11 interfaces, gives rise to the problem that there may not be sufficient room on the wafer for so many tabs. A system which facilitated the measurement of resistance across each of numerous interfaces while minimizing the number of tabs required, and simplified the test instrument requirements, would facilitate the testing of integrated circuits. The utilization of such interface measurements to predict the yield of integrated circuits, would be of further value.

SUMMARY OF THE INVENTION

In accordance with one embodiment of the present invention, a system is provided for facilitating the testing of integrated circuits, and in particular the interfaces between different conducting (or semi-conducting) layers of a circuit. A contact chain can be established beside an integrated circuit, the chain including a plurality of conductive segments formed in the two layers, and interfaces between the two layers for conducting segments in alternate layers in series. A first and last conductive tab is connected to the end of the chain to enable a current to be passed along the chain through its interfaces. A plurality of pairs of voltage tabs are provided which connect to the two different layers at each interface along the chain, to enable a voltage measurement to be made across a corresponding interface. While a current is passing along the length of the chain, the instrument makes voltage measurements across the pairs of voltage tabs, to thereby measure the resistance or conductances across each of the interfaces.

The conductances measured across the numerous interfaces can be plotted on a normal probability graph, with each point on the graph having an ordinate equal to the conductive across an interface, and with points of progressively lower conductance having abscissas progressively further from a minimum abscissa value of the graph. A straight line passing approximately through the points, can be extended to indicate the probability that one of the interfaces will be below a level required for operation of a circuit containing the interface. This enables a determination of the probability of a catastrophic failure of an integrated circuit containing the interfaces.

The novel features of the invention are set forth with particularity in the appended claims. The invention will be best understood from the following description when read in conjunction with the accompanying drawings.

DESCRIPTION OF THE PREFERRED EMBODIMENTS

Figure 1:
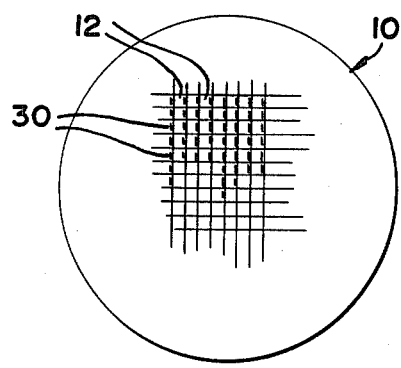
FIG. 1 is a simplified plan view of a workpiece constructed in accordance with the present invention.

FIG. 1 illustrates a workpiece 10 in the form of a wafer or substrate which contains many integrated circuits 12. Each integrated circuit includes a pair of conductive (possibly semi-conductive) layers that are separated with one below the other, but with the layers in contact at interfaces.

Figure 2:
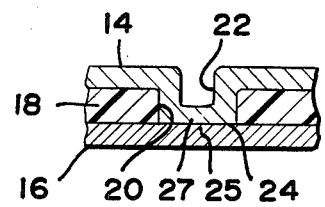
FIG. 2 is a sectional side view of an interface in the workpiece of FIG. 1.

FIG. 2 illustrates a portion of such an arrangement, wherein a first level (Schottky) metal layer 16 lies below a second level metal layer 14, the two layers being isolated by an insulator 18. The insulator 18 has a hole 20 ("Vias") which is plated by a conductor 22 such as a portion of the upper layer 14. The conductor 22 makes contact with the lower layer 16 at an interface 24. The resistance at the interface 24 is preferably as low as possible, but may be unexpectedly high due to oxides and residues. It is such high resistance, or low conductance, at an interface, which is a major source of faults in the integrated circuits. The interface resistance can be measured by passing a current between opposite ends 25, 27 of the interface, and measuring the voltage between the interface opposite ends.

In order to determine the condition of the interfaces, test circuits (FIG. 1) can be formed on the same workpiece 10 which contains the integrated circuits. The test circuit includes regions of the upper and lower layers 14, 16 and interfaces 24 between them. The test circuit also has conductive terminals or tabs on the surface of the workpiece, where test instruments can make contact with the tabs to measure resistance at the interfaces. It may be noted that the test circuits 30 may be placed along "saw" lines lying between the integrated circuits, where they will be sawed apart, so as to avoid taking up space that might otherwise be occupied by additional integrated circuits. In order that each test circuit can include numerous interfaces, and the resistance across each interface can be individually measured, a considerable number of test tabs are required. It is desirable that the number of test tabs be minimal, so they occupy a minimum of space on the workpiece.

Figure 3:
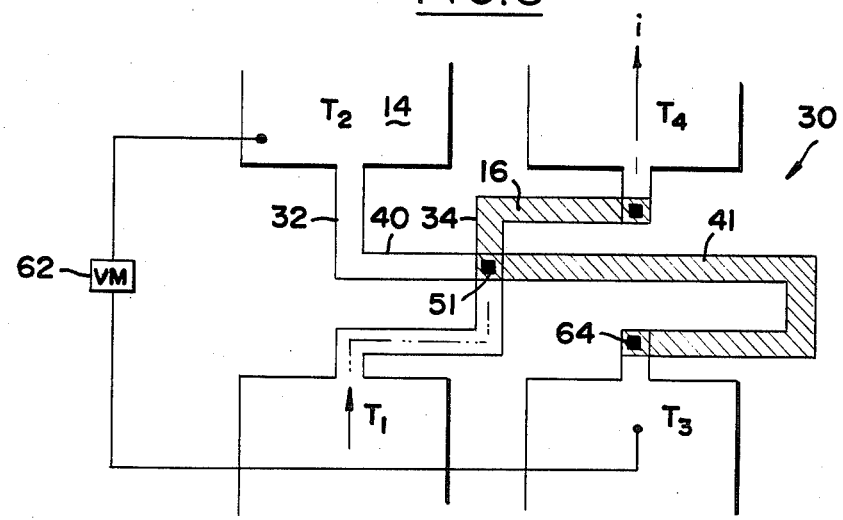
FIG. 3 is a plan view of a portion of a test circuit of the workpiece of FIG. 1, with the lower layer highlighted by cross hatch-like lines.
Figure 5:
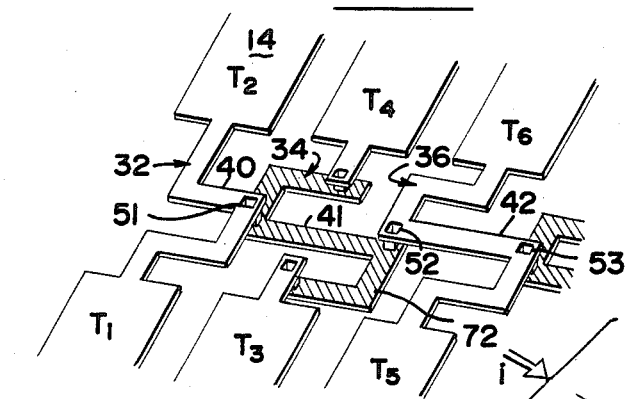
FIG. 5 is a partial perspective view of the test circuit portion of FIG. 3.

FIG. 3 illustrates a portion of a test circuit 30 of the present invention. The circuit includes numerous conductive tabs labeled $T_1$, $T_2$, etc., that are all formed in the upper layer 14. As also shown in FIG. 5, a conductive strip 32 is formed in the top layer 14 between tabs $T_1$ and $T_2$. Another conductive strip 34 is formed in the bottom layer 16 and joins the tabs $T_3$ and $T_4$ through interfaces. A third conductive strip 36 in the upper layer joins tabs $T_5$ and $T_6$. The conductive strips have conductive segments 40, 41, 42, 43, etc., which alternate between the upper and lower layers 14, 16 and which are interconnected by interface joints or interfaces 51, 52, 53, etc. These interfaces 51, 52, etc., are interfaces whose resistance or conductance can be measured by the method and apparatus of the present invention.

As indicated in FIG. 3, one way for measuring the interface resistance across the interface 51 is to pass a current "i" between tabs $T_1$ and $T_4$, so that current passes through the interface 51. While such a current is flowing, a voltmeter 62 is connected to tabs $T_2$ and $T_3$. Tab $T_2$ is connected to the upper layer at the interface 51, while tab $T_3$ is connected through an interface 64 and conductive segment 41 to the bottom layer at the interface 51. Since current is flowing between the top and bottom layers at the interface 51 and the voltmeter is connected to the upper and lower layers at the interface, the voltage is proportional to the resistance across the interface. For example, if the current i is 100 microamperes and the voltage measured by the meter 62 is 10 microvolts, then the resistance across the interface 51 is 0.1 ohms and the conductance is 10 mho. While it is possible to repeat this procedure for each of the interfaces 51, 52, etc., applicant simplifies the procedure by passing a current through the entire chain of conductive segments and then measuring the voltage across the pairs of tabs connected to opposite sides of each interface. By applying current only once, applicant avoids the additional time required in each application of current, to wait for the current to settle down to a steady-state condition.

Figure 4:
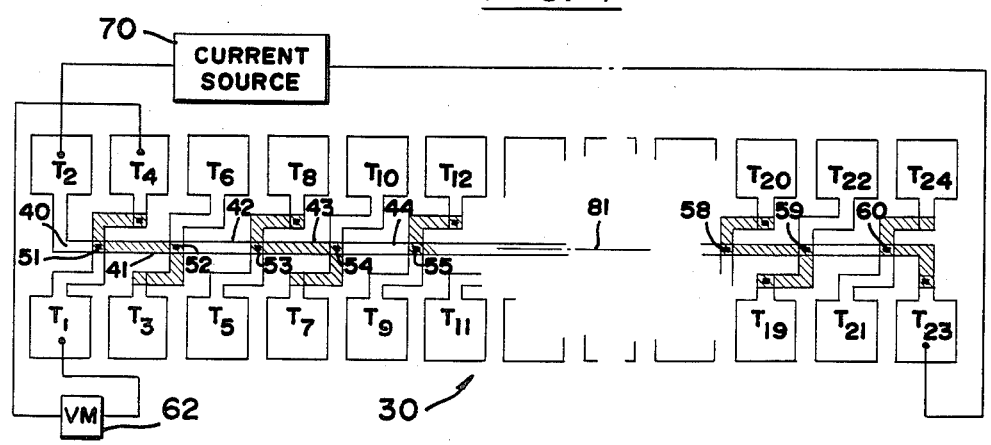
FIG. 4 is a plan view similar to that of FIG. 3, but showing additional portions of the test circuit.

FIG. 4 illustrates a preferred test set-up for a test circuit 30 containing eleven interfaces whose resistance can be measured. The conductive segments 40, 41, 42, etc., are arranged along an imaginary line segment 81, with a pair of current tabs $T_2$, $T_{23}$ at opposite ends, and with voltage tabs along opposite sides of the line segment. A current source 70 is applied between tabs $T_2$ and $T_{23}$, so the current flows between conductive strips 40, 41, 42, etc., located on the alternate layers, with the current flowing through the interfaces 51-60, etc., in passing between the layers. This establishes a predetermined current through each of the eleven interfaces 51-60.

While the current is flowing, a voltmeter 62 measures the voltage between a pair of tabs $T_1$ and $T_4$ which are in contact with opposite sides of the interface 51. After this voltage measurement, the voltmeter is connected between a next pair of tabs $T_3$ and $T_6$ to measure the voltage across interface 52. The voltage measurements continue across the tab pairs $T_5$ and $T_8$, and $T_7$ and $T_{10}$, and so forth, until the tabs $T_{21}$ and $T_{24}$. Thus, the test chain which enables the measurement of resistance or conductance across each of eleven interfaces, requires eleven pairs of tabs plus two tabs for the current source. Since the voltmeter 62 has a very high input impedance, its connection to the different pairs of tabs creates negligible transients, and the measurement of voltages across eleven pairs of tabs can be conducted rapidly. After the voltages across one test circuit 30 are completed, the test instrument can be moved to another test circuit on the wafer by lifting its twenty-four contacts off the tabs $T_1$–$T_{24}$ of one test circuit and repositioning them on the test tabs of the next circuit.

Figure 6:
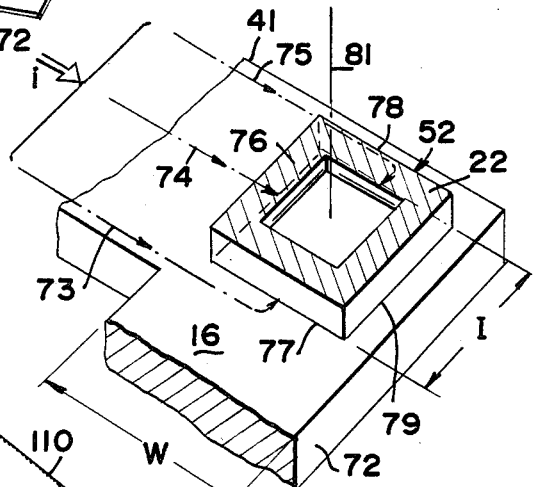
FIG. 6 is an enlarged view of a portion of the circuit of FIG. 5.

It can be seen in FIG. 5 that the conductor portion, such as 72, which leads from the location where an interface 52 contacts the lower layer 16, to a voltage tab extends from a side of the interface. The portion 72 extends along a path that is substantially separate from the series-connected strips such as 41, so current passing through the series-connected strips does not pass substantially through the voltage tabs (only a very small current—at least an order of magnitude less than that in the strips 41, 42, etc.—required to make a voltage measurement, passes through the portion 72). FIG. 6 shows the general paths 73, 74, 75 of current flow between the conductive strip 41 and the interface conductor 22 which extends up to the upper layer. Much of the current i flows into the "front" 76 of the interface, while a significant portion flows into the sides 77, 78 of the interface. Very little current flows into the rear 79.

The lower layer 16 is generally of a material of much higher resistivity than the upper layer 14. Accordingly, a voltage measurement taken a small distance from the front 76 will include a voltage drop due to current flow through a length of the resistive strip 41. On the other hand, a voltage measurement taken a distance from the rear 79 where there is almost no current flow, will not include some of the voltage drop caused by currents 73-75 passing through the front and sides of the interface. Applicant takes a voltage measurement from a side 77 (which leads to conductor portion 72 which extends to tab $T_3$), whose voltage is affected by much of the voltage drop through the interface but very little of the voltage drop along the current carrying strip 41. Having the conductor 72 extending from a location angled about 90° from the "front" location 76, with respect to an interface axis 81 normal to the lower layer and passing through the center of the interface, also enables the same voltage measurement whether from one side 77 or the other 78. In one test circuit, the conductors 41, 72 have a width W of three microns, while the interface has a width I of two microns.

Figure 7:
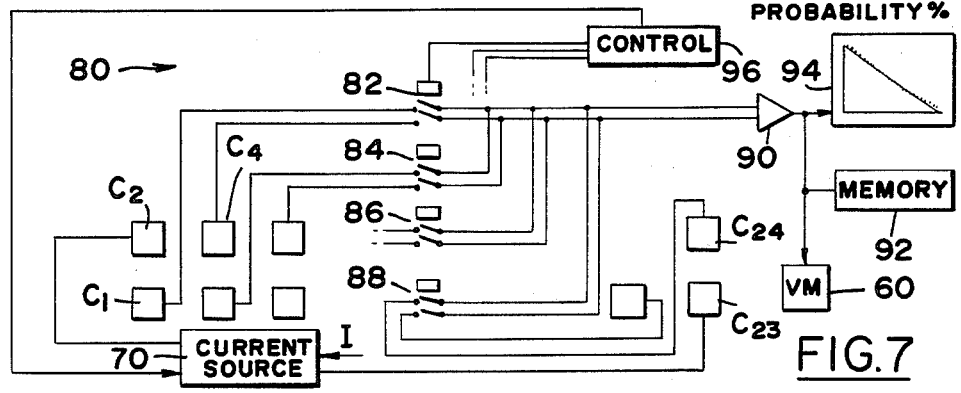
FIG. 7 is a diagrammatic view of a test instrument useful with the test circuit of FIG. 3.

FIG. 7 is a simplified diagram of a test instrument 80. The instrument has twenty-four contacts labeled $C_1$–$C_{24}$ which match the twenty-four tabs on a test circuit. A current source 70 is connected across the tabs $C_2$ and $C_{23}$. A group of relays 82, 84, 86, 88, etc., can be alternately closed to connect a pair of contacts such as $C_1$ and $C_4$ to an amplifier 90. The output of amplifier 90 can be delivered to a voltmeter 60, a memory 92, and a plotter 94. After each voltage measurement is taken, one of the relays 82 is opened, and the next relay such as 84 is closed. A control 96 turns on the current source 70, waits a short period of time for the current to settle, and then cycles the relays 82, etc., in sequence.

Figure 8:
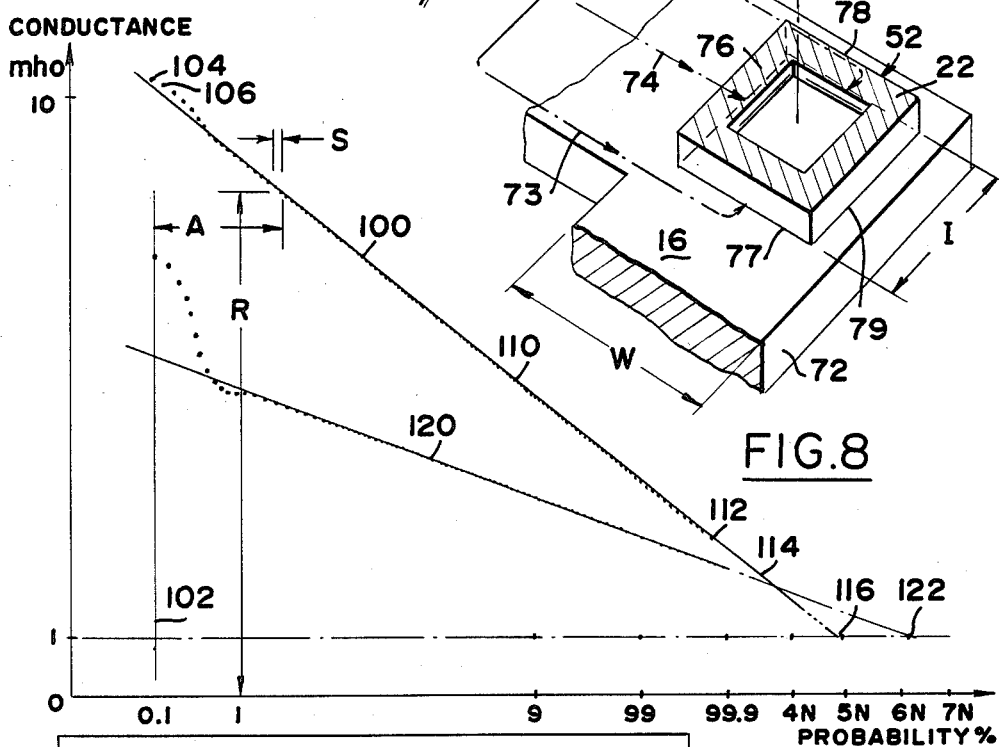
FIG. 8 is a normal probability graph of conductances versus probability, that can be constructed from data obtained with the test instrument of FIG. 7.

A wafer 10 (FIG. 1) may contain eighty-eight integrated circuits and eighty-eight test circuits 30, with each test circuit having perhaps eleven interfaces whose resistance is measureable. Thus, about one thousand interface resistance, or conductance, measurements can be made. Such a large number of measurements can be used to predict the probability of the integrated circuits failing because of excessive resistance at one of their interfaces. Each integrated circuit may have perhaps 1,000 interfaces. As shown in FIG. 8, applicant establishes a predetermined minimum interface conductance level such as 1 mHo (1 ohms resistance), or even 0 mho, at which an integrated circuit is likely to fail. The conductance measurements at the eleven interfaces of each of the eighty-eight test circuits is then plotted on a normal probability graph of the type shown in FIG. 8. The conductance for each interface equals the current passing through the interface divided by the voltage between a pair of tabs that are connected to opposite ends of the interface.

A multiplicity of points 100 are established on the graph of FIG. 8, with each point having an ordinate R equal to the conductance measured in a measurement. Points of progressively lower conductance have an abscissa A that is progressively further from a minimum abscissa value 102. The points are spaced apart along the abscissa at probability intervals S about equal to one divided by the total number of points. Thus, if 1,000 measurements are taken, the first point 104 (of greatest conductance) will be at the abscissa value of 0.001, or 0.1%. The next point 106 will be at the abscissa value 0.2%, etc. When plotted on a normal probability graph of the type shown in FIG. 8, points further from the minimum abscissa level will be progressively closer together up to the probability of 50%; beyond 50% the points will be progressively further apart in the abscissa direction. An imaginary straight line 110 is fitted to the curve so that it is close to lying on all of the points (at least the majority of points of lowest conductivity). The line 110 can be extended to provide a useful measurement.

It can be seen in FIG. 8 that the point 112 representing the lowest conductance for all 1,000 measurements is still considerably above the lowest acceptable level which is one mho. (If the lowest acceptable level is much less than 10 mho, zero can be used as the lower level). The extension portion 114 of the line 110 will intercept the minimum conductance level at a point 116 (representing five nines, or 99.999%). The probability of an interface having such a low conductance is indicated along the abscissa of the graph at the point 116, where the probability is 1−99.999%=0.001%. In other words, the probability is 1/100,000 that an interface conductance will drop below the minimum permissible level for circuit operation. Where each integrated circuit has 1,000 interfaces, this indicates that only 1 circuit out of 100 is likely to have a failure. FIG. 8 shows another graph 120 for the test circuits on another wafer, where the average conductance is lower than in the graph 110. However, the line 120 connecting conductances arranged in order of conductance on the probability graph, shows a smaller slope of conductivity decrease with order of probability. The graph 120 intersects the minimum conductance level at the point 122, where the probability is 99.9999%, meaning that the probability of an interface failure is 1/1,000,000. The normal probability graphs of FIG. 8 can be plotted by hand or by a plotter as shown at 94 in FIG. 7.

Thus, the invention provides a test method and apparatus for facilitating the testing of interfaces between a pair of at least partially conductive layers on a workpiece which holds one or more integrated circuits. A test circuit includes a contact chain with multiple conductive segments alternating between the different layers and connected in series through interfaces connecting the beginning of a segment on one layer to the end of a segment on another layer. The chain includes a pair of end tabs at opposite ends of the chain of conductive segments, for passing a current through the chain, and pairs of tabs spaced along the chain and that are connected to the opposite sides of each interface along the chain. A test instrument includes a current source for passing current between the end tabs and contacts for measuring the voltages across each pair of tabs that are connected to the opposite sides of each interface along the chain. The conductance measurements can be plotted on a normal probability graph with measurements of lower conductivity spaced progressively along the abscissa. A straight line drawn through the points will then pass through a minimum conductance level at a discernable probability level. One minus that probability equals the probability of failure of a single interface on the workpiece, such as in a test circuit or the integrated circuit.

Although particular embodiments of the invention have been described and illustrated herein, it is recognized that modifications and variations may readily occur to those skilled in the art, and consequently, it is intended that the claims be interpreted to cover such modifications and equivalents.

What is claimed is:

1. In combination with a substrate having an integrated circuit which includes separated upper and lower conductive layers and multiple interfaces between them, a test circuit which also includes said upper and lower layers, comprising:
   a plurality of conductive strips formed in both said upper and lower layers, and a plurality of interfaces each connecting an end of a strip in one layer to an end of a strip in another layer, said strips being connected in series through said interfaces;
   a pair of current tabs formed in said upper layer and connected to opposite ends of said series-connected strips, to provide tabs for passing a current through the series-connected strips;
   a plurality of pairs of voltage tabs formed in said upper layer, first means for connecting one tab of each pair to an end of a conductive strip that is formed in said lower layer and that lies at an interface, and second means for connecting the other tab of the pair to the end of the conductive strip that is formed in said upper layer and that lies at the same interface, said first and second means each extending along a path that is substantially separate from said strips so the current passing through said strips does not pass substantially through said first and second means.

2. The combination described in claim 1 wherein:
   said first means comprises a conductor portion formed in said lower layer and which extends away from said interface at an angle of about 90° from the angle at which said conductive strip in said lower layer extends away from said interface, with respect to an imaginary axis that is normal to said lower layer and that passes through said interface.

3. The combination described in claim 1 wherein:
   said strips are located along an imaginary line segment, said current tabs are located at the opposite ends of said line segment, and the voltage tabs of each pair are located on opposite sides of the line segment.

4. The combination described in claim 1 including:
a test instrument having a current source and having contacts which can engage said current tabs to pass a current between them;
said test instrument also having pairs of voltage contacts arranged to contact said pairs of voltage tabs, voltage measuring means, and means for sequentially connecting different pairs of said voltage contacts to said voltage measuring means.

5. In combination with a workpiece having at least two layers that are each at least partially conductive, and which includes an integrated circuit formed of portions of said two conductive layers and multiple spaced interfaces between the layers, a test circuit comprising:
a contact chain comprising portions of said two layers in the form of a plurality of spaced conductive strips in each layer and multiple interfaces connecting strips of different layers in a series connection, said contact chain also having multiple pairs of easily accessible voltage tabs, with each pair connected to the opposite ends of an interface;
means for passing a current in series through said multiple interfaces of said contact chain, which establishes a voltage between each of said pairs of voltage tabs; and
means for measuring the voltage between each of said pairs of voltage tabs, while said current continues to pass through said interfaces.

6. The combination described in claim 5 wherein:
said contact chain interfaces are arranged substantially along an imaginary line segment of limited length, and said voltage tabs are arranged along opposite sides of said line segment; and
said contact chain includes two current tabs connected to opposite ends of said chain, said means for passing current includes a pair of contacts positioned to contact said current tabs.

7. The combination described in claim 5 including:
making a total number of measurements of voltage between pairs of said voltage tabs and calculating a conductance for each measurement equal to the current passing through an interface divided by the voltage between a pair of tabs connected to the opposite ends of the interface;
means for plotting, on a normal probability graph, said conductance measurements, including means for establishing a multiplicity of points on said graph with each point having a position along an ordinate of the graph equal to the conductance of a measurement, and with points of progressively lower conductances located progressively further along the abscissa of the graph at spacings of about one divided by the total number of measurements;
means for establishing a probability number, along the abscissa of the graph, where a straight line which extends substantially through said points, intersects a substantially zero conductance level.

8. A method for testing a workpiece which includes a substrate and an integrated circuit on said substrate, said integrated circuit having at least two conductive layers and multiple spaced interfaces between the layers, comprising:
establishing a contact chain on said substrate, wherein the contact chain includes two conductive layers of the same material as said two conductive layers of said integrated circuit, and said chain includes multiple interfaces between said conductive layers of said chain, including establishing pairs of accessible voltage conductive tabs with the two tabs of each pair connected to the two opposite ends of each of a plurality of chain interfaces;
said step of establishing including establishing a series of conductive path segments that connect said chain interfaces in series, and establishing a pair of accessible current conductive tabs at opposite ends of said series of conductive path segments, said series of conductive segments arranged so alternate segments are formed in alternate ones of said chain conductive layers;
passing a current between said current tabs, so said current flows through said chain interfaces; and
measuring the voltage difference between each of said pairs of voltage conductive tabs, while said current is passing between said current tabs.

9. The method described in claim 8 wherein:
said step of establishing a contact chain includes establishing said conductive segments so they lie substantially on an imaginary line segment;
said step establishing voltage tabs includes extending a conductor portion in the lower layer which extends away from the lower layer in an interface, in a direction that is substantially perpendicular to said imaginary line segment, and connecting an end of said conductor portion which is opposite said interface to one of said voltage tabs of a pair.

10. The method described in claim 8 wherein:
said step of measuring the voltage difference includes contacting each of a plurality of pairs of test instrument contacts with said pairs of voltage tabs, and subsequently connecting each of said test instrument contact pairs to a voltage measuring device while said current is passing between said current tabs.

11. The method described in claim 8 wherein:
said step of measuring the voltage difference includes plotting a conductance, equal to a ratio of said current to the voltage difference in each measurement as a point on a normal probability graph, with each point having an ordinate equal to the conductance derived from a measurement, and with points of progressively lower conductance having an abscissa progressively further from a minimum abscissa value of the graph, at spacings about equal to probability intervals along the abscissa of the graph.

12. In a method for testing an integrated circuit on a workpiece, where the circuit includes at least two conductive layers and multiple spaced interfaces between the layers, by taking measurements of the conductances at each of a multiplicity of interfaces between two corresponding conductive layers along a test chain on the workpiece, the improvement comprising:
establishing a predetermined interface conductance level which is below an interface conductance required to enable integrated circuit operation;
plotting, on a normal probability graph, said conductance measurements, including establishing a predetermined number of points on said graph with each point having an ordinate equal to the conductance measured in a measurement, and with points of progressively lower conductance having an abscissa progressively further from a minimum abscissa value of the graph, at spacings about equal to one divided by said predetermined number of points;

establishing a probability number along the abscissa where a straight line extending substantially through said points intersects said predetermined interface conductance level, whereby to obtain an indication of the probability that each interface of the integrated circuit will have a conductance no higher than said predetermined conductance level.

* * * * *